United States Patent [19]

Heigl et al.

[11] Patent Number: 4,577,171

[45] Date of Patent: Mar. 18, 1986

[54] INPUT CIRCUIT COMPRISING AT LEAST TWO INPUT PATHS

[75] Inventors: Franz Heigl, Ochsenfeld; Josef Rehm, Rohrbach, both of Fed. Rep. of Germany

[73] Assignee: Telefunken electronic GmbH, Heilbronn, Fed. Rep. of Germany

[21] Appl. No.: 609,205

[22] Filed: May 11, 1984

[30] Foreign Application Priority Data

May 11, 1983 [DE] Fed. Rep. of Germany ....... 3317219

[51] Int. Cl.$^4$ .................. H03J 5/00; H04B 1/18
[52] U.S. Cl. .................... 334/1; 333/103; 334/47; 455/188
[58] Field of Search ............ 334/1, 3, 47, 60; 455/180, 188, 191; 333/101, 103

[56] References Cited

U.S. PATENT DOCUMENTS

| 4,291,290 | 9/1981 | Ijichi et al. | 334/1 |
| 4,418,428 | 11/1983 | Evans | 455/180 |

FOREIGN PATENT DOCUMENTS

| 2805447 | 8/1979 | Fed. Rep. of Germany | 334/1 |
| 121740 | 9/1980 | Japan | 455/180 |
| 151811 | 11/1980 | Japan | 334/3 |
| 013035 | 1/1983 | Japan | 455/188 |
| 2058500 | 4/1981 | United Kingdom | 455/180 |

*Primary Examiner*—Paul Gensler
*Attorney, Agent, or Firm*—Spencer & Frank

[57] ABSTRACT

An input circuit comprises at least two input paths which are connected to a common input terminal and which are alternately connectable to a common output. The input paths form selection members for the UHF and VHF frequency range whose signals are amplified in a common preamplifier component. In order to avoid mutual influencing of the selection members with simple measures, the output of the VHF selection member is connected to the common output via an impedance of the UHF selection member and a switch is provided for connecting the impedance and the output of the VHF selection member to ground for high frequency. The switch is conductive during UHF operation and then short circuits the output of the connected VHF input path.

17 Claims, 2 Drawing Figures

INPUT CIRCUIT COMPRISING AT LEAST TWO INPUT PATHS

BACKGROUND OF THE INVENTION

1. Field of the Invention

The invention relates to an input circuit comprising at least two input paths which are alternately connectable to a common output and have a common switch to ground, and further comprising switches for the input paths, in particular, for combination tuners with input circuits for UHF and VHF and a common preamplifier component.

2. Description of the Prior Art

In a known input circuit of this kind (German Auslegeschrift No. 25 03 785) a combination tuner is provided with three separate input paths located at a common input and alternately connectable, via individual, series-connected switches, to a common output. The input paths constitute selection members or filters for the UHF, the high VHF band and the low VHF band ranges. The common output is connected to a control electrode of a common preliminary stage transistor. The danger inherent in this design is that the fully functioning selection members, due to their desired high selection characteristics when the switching path is open, couple unacceptably high signals into the usable signal of the actuated selection member through the capacitance of the switches.

SUMMARY OF THE INVENTION

The object underlying the invention is to take measures in an input circuit for a combined UHF and VHF tuner including at least two alternatively actuatable input paths, one of which is a UHF selection circuit and another of which is a VHF selection circuit, connected between a common antenna input terminal and a common output amplifier, by means of which measures full efficiency of the actuated input path is attained, while the non-actuated input path is strongly damped and out-of-tune.

This object is attained in accordance with the invention by an input circuit for a combined UHF and VHF tuner having a common antenna terminal for a UHF selection filter and for a VHF selection filter and a common amplifier connected subsequent to the two selection filters, wherein: the output of the UHF selection filter is connected to the input of the amplifier; the UHF selection filter includes an impedance having one end connected with the input of the amplifier and whose other end can be connected to ground for high frequency via a switch; the output of the VHF selection filter is connected via the impedance to the input the amplifier and is connected to the switch and can be connected to ground for high frequency via the switch; and the switch is blocked (open) for VHF selection and conducting (closed) for UHF selection.

According to one embodiment of the invention, the first input path constituted by the UHF selection filter is a high pass filter for the UHF range having two shunt inductances, a further switch is connected in the series path between the two shunt inductances, the shunt inductance at the output side of the UHF selection filter constitutes the impedance, the output of the second input path, i.e., the VHF selection filter, is connected to the connection of the impedance on the side on which it is connected to the first mentioned switch, and both switches assume the same switched state.

In this embodiment according to the invention, the first input path is made fully operative when current is flowing through the switches and the signal from the second input path is short circuited by the first mentioned switch. This switch effects a necessary ground connection for the first input path. Accordingly, the selection member for UHF is made fully operative, while the selection member for VHF is put out-of-tune by the short circuit and, in addition, strongly damped so that no disturbing VHF signals are coupled into the UHF selection member via the ground connection through which current is flowing.

During VHF operation, on the other hand, when no current is flowing through the switches, the selection member for UHF is firstly interrupted and secondly put out-of-tune by the actuated VHF selection member so that selection in the UHF band no longer occurs. According to a modification of the invention, instead of using a high pass filter for the UHF range, the first input path may be constituted in the form of a half-wave length resonant circuit for the UHF range with a capacitance diode at the base of the circuit and an alignment inductance branching off from the capacitance diode for alignment at the upper frequency band end and connectable to ground via the first mentioned switch, and with the second input path connected between the alignment inductance and this switch.

In this embodiment with a UHF selection circuit of variable frequency, one switch in the path from the alignment coil required for the upper frequency range to ground is adequate since such an extensive detuning occurs when no current flows through the switch and by way of the VHF range filtering components then connected to the UHF selection circuit that UHF signals are suppressed. The components of the UHF resonant circuit are then simultaneously components of the VHF selection members.

DESCRIPTION OF THE PREFERRED EMBODIMENTS

Figure 1:
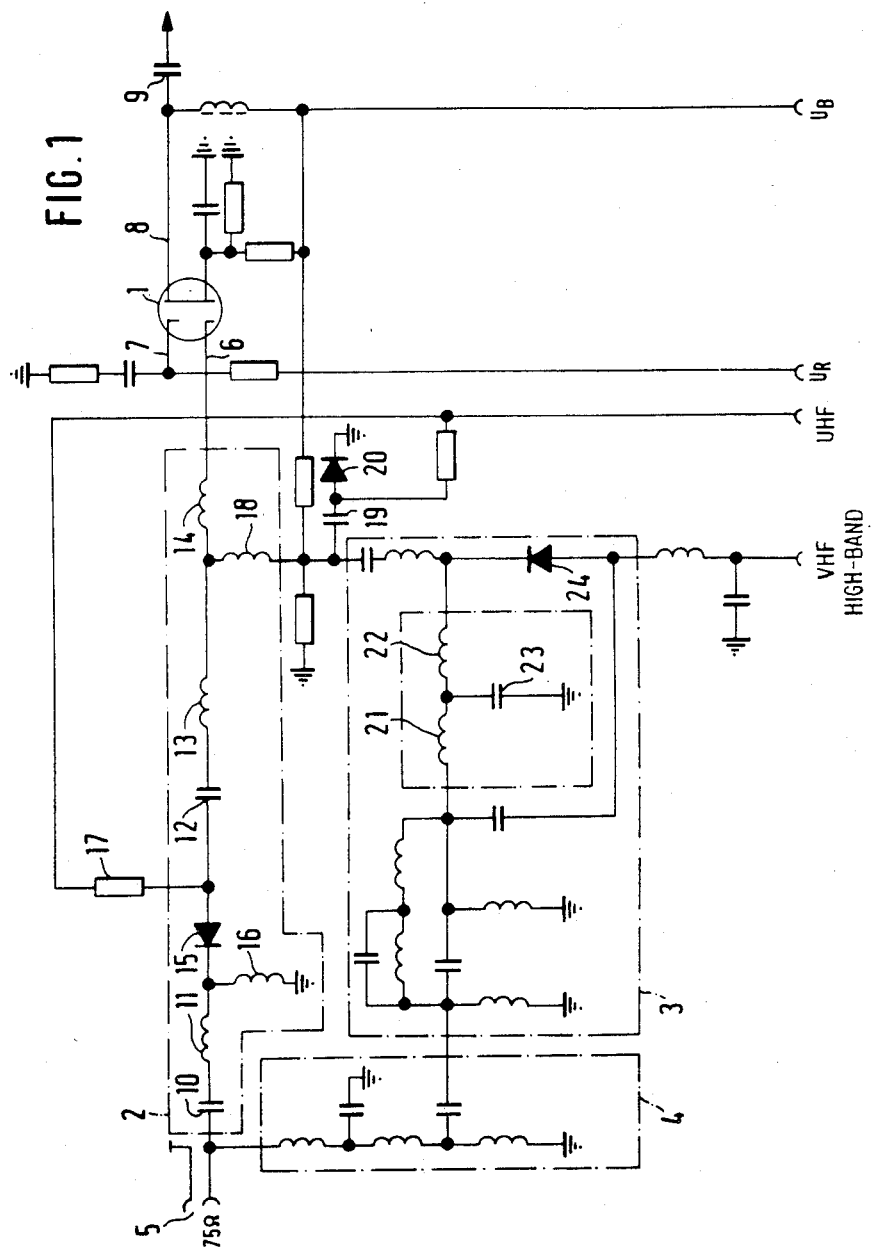
FIG. 1 is a schematic circuit showing a preliminary stage circuit, according to one embodiment of the invention, with non-tunable selection members for the UHF and VHF ranges.

As shown in FIG. 1, a preliminary stage according to the invention for a combined UHF-VHF tuner basically includes a metal oxide semiconductor field-effect output transistor 1 or input, a UHF selection member 2 and a VHF selection member 3. A low-pass filter 4, having an upper limit frequency which lies between the UHF range and the VHF high-band range, is connected in series with the input of the VHF selection member 3. The inputs of the selection member 2 and of the selection member 3 via the low-pass filter 4 are connected to a common antenna connection 5. The outputs of the selection members 3 and 4 are commonly connected to a gate 6 of the metal oxide semiconductor field-effect transistor 1, whose second gate 7, for high frequency, is practically connected to ground. The amplified high frequency signal is then passed on via the drain electrode 8 and an isolating capacitor 9 to a band-pass filter which is not illustrated.

In accordance with FIG. 1, the UHF selection member 2 consists of a transforming high-pass filter which enables the characteristic impedance at the antenna input 5 and the input resistance at the gate 6 of the metal oxide semiconductor field-effect transistor 1 to be matched. The high-pass filter comprises a capacitor 10, an inductance 11, a further capacitor 12 and two further inductances 13 and 14, all of which are connected in series. Inserted between the inductance 11 and the capacitor 12 is a switching diode 15 which is preferably a PIN diode. At the point of connection of the switching diode 15 and the inductance 11, a shunt inductance 16 is connected to ground, while the control current is fed to the other connection of the switching diode 15 via a resistor 17. Connected to the connection point of the inductance 13 and the inductance 14 leading to the gate 6, is an additional shunt inductance 18 which is connected via a DC-isolating capacitor 19 to a switching diode 20 acting as a switch to ground. The control current for the switching diode 20 is supplied via a resistor which is connected to the same control current line as the resistor 17. Accordingly, when current flows through the diodes 15, 20, the UHF selection member 2 is actuated.

The transition of the VHF selection member 3 to the UHF selection member 2 occurs at the connection point of the second shunt inductance 18 and the DC-isolating capacitor 19. When current flows through the switching diode 20, this connection point is, in high frequency terms, at ground potential, so that any selected VHF signals are connected to ground. During UHF operation, the VHF signals are, therefore, short circuited. When the diodes 15, 20 are blocked, the UHF selection member 2 is, on the other hand, blocked or out-of-tune, while the VHF selection member 3 then guides the selected VHF frequency band via the shunt inductance 18 and the inductance 14 to the gate 6 of the metal oxide semiconductor field-effect transistor 1 for amplification.

The selection member 3 includes a low-pass filter which consists of two series inductances 21 and 22 and a shunt capacitor 23 and is short circuited via a third switching diode 24 during operation in the VHF high-band range as a result of a control signal supplied to the switching diode 24. With the low pass filter 21, 22, 23 short circuited via the diode 24, the selection circuit 3 forms a high pass filter whose lower limit frequency lies above the VHF low-band range. For selection of the VHF low-band range, the switching diode 24 is, on the other hand, blocked, so that the entire selection member 3 including the active inductances 21 and 22 and the shunt capacitor 23 operates as a bandpass filter which blocks both the frequencies of the VHF high-band range and the lower video intermediate frequency.

Figure 2:
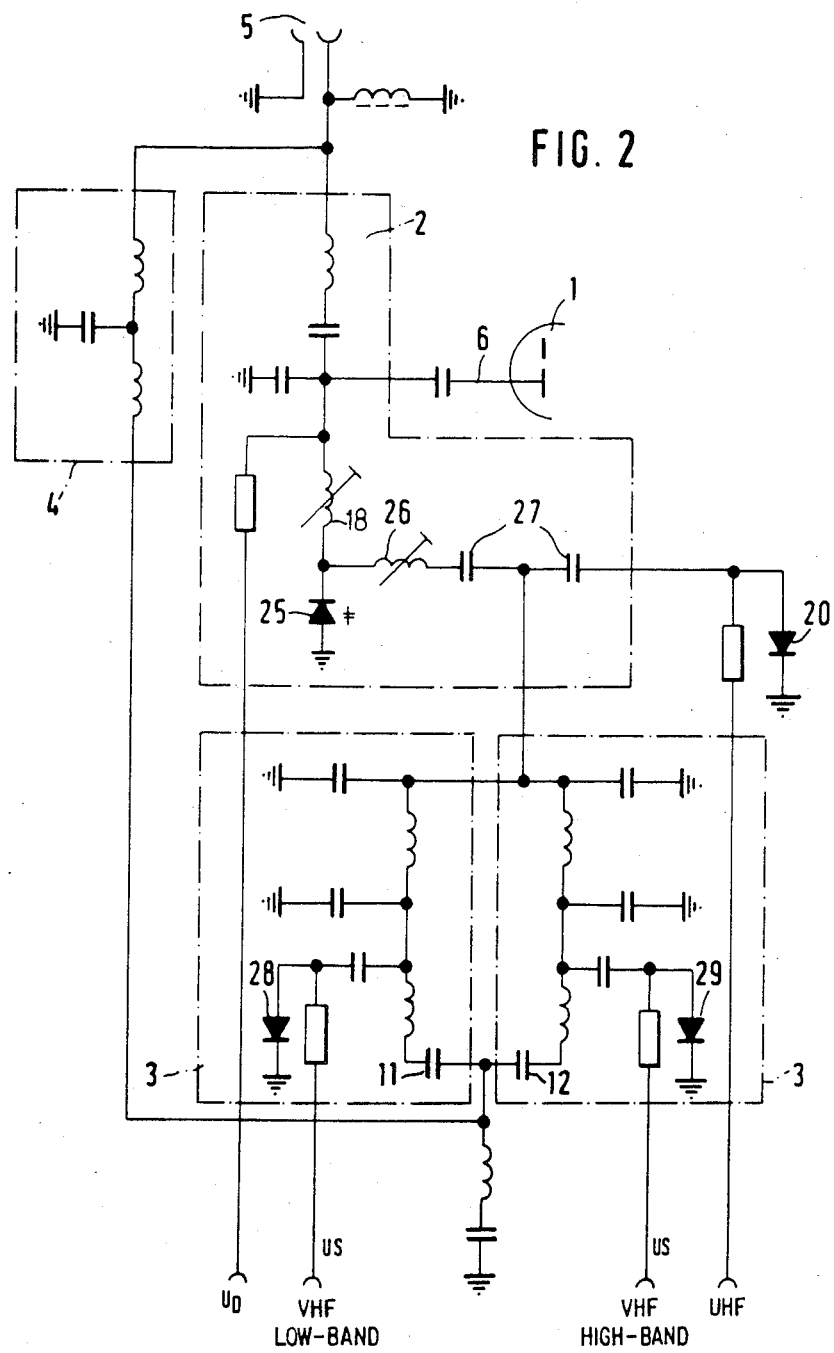
FIG. 2 is a schematic circuit showing a preliminary stage circuit, according to a further embodiment of the invention, with a variable frequency UHF input circuit and non-variable frequency VHF selection members.

In accordance with FIG. 2, the input circuit comprises as the selection member 2 for the UHF range a variable frequency tuning circuit in half-wave length technique with a tuning diode 25 connected to ground from which an alignment coil 26 for the upper frequency range is connected to ground during UHF operation via DC-isolating capacitors 27 and the switching diode 20 acting as a switch.

Accordingly, during UHF operation, the selection member 2 acts as a half-wave length resonant circuit which can be tuned by the tuning diode 25. During VHF operation, on the other hand, the switching diode 20 is blocked. In this embodiment separate selection members or band-pass filters 3 are provided for the VHF low-band range and for the VHF high-band range.

The selection members 3 designed for the VHF low band range and the VHF high-band range, respectively, have their inputs commonly connected via the low-pass filter 4 to the antenna 5 and their outputs commonly connected to the connection point betwen the DC-isolating capacitors 27. Consequently during UHF operation when current flows through the switching diode 20, these selection members 3 are again short circuited to ground at the connection remote from the antenna i.e., at their common output.

When the switching diode 20 is blocked, on the other hand, the respectively selected VHF frequency band is fed via the alignment coil 26 to the impedance 18 and directed from there to the gate 6 of the metal oxide semiconductor field-effect transistor 1.

During VHF operation, one of the selection members 3 can be connected, in high frequency terms, to ground, via switching diodes 28 and 29, respectively, so that only the frequencies of the second frequency ranges are selected and directed to the gate 6 for further amplification.

What is claimed is:

1. An input circuit for a combined UHF and VHF tuner comprising in combination: a common antenna terminal; a UHF selection filter and a VHF selection filter each having its input connected to said common antenna terminal; a common output amplifier for said input circuit, said amplifier having its input connected to the output of said UHF selection filter; an impedance included in said UHF selection filter and having one end connected for high frequency to said input of said amplifier; first circuit means, including a controllable switch, for connecting the other end of said impedance to ground for high frequency via said switch when said switch is closed; and second circuit means for connecting the output of said VHF selection filter to said other end of said impedance so as to cause said output of said VHF selection filter to be connected to ground for high frequency via said switch when it is closed and so as to cause said output of said VHF selection filter to be connected to said input of said amplifier when said switch is open.

2. An input circuit according to claim 1 wherein said switch is a switching diode which is in the conducting switched state during UHF operation.

3. An input circuit according to claim 1 wherein: said UHF selection filter is a high-pass filter for the UHF range including two shunt inductances; a further switch is located in the series path between said shunt inductances; the one of said shunt inductances at the output side of said UHF selection filter constitutes said impedance; and circuit means are provided for controlling said switches so that they both assume the same switched state.

4. An input circuit according to claim 3 wherein: said further switch is a PIN diode; said circuit means for controlling includes an ohmic resistor connecting the anode of said PIN diode to an input terminal for a control voltage source which is also connected to said switch connected to said impedance; and the cathode of said PIN diode is connected to one end of the other said shunt inductance whose second end is directly connected to ground.

5. An input circuit according to claim 1 wherein: said input of said VHF selection filter is connected to said antenna terminal via a low-pass filter with an upper limit frequency which lies between the UHF range and the VHF high-band range; and said VHF selection filter comprises a high-pass filter for the VHF high-band range whose lower limit frequency lies above the VHF low-band range.

6. An input circuit according to claim 5 wherein: inserted in said high-pass filter for the VHF high-band range are two series-connected inductances whose connection point is connected to ground via a capacitor, and a switching diode bridging the series connection of said two inductances; and means are provided for selectively causing said switching diode to conduct current so that when there is no current flowing through said switching diode and said switch, said VHF selection filter constitutes a band-pass filter for the VHF low-band range.

7. An input circuit according to claim 9 wherein: said UHF selection filter is in the form of a resonant circuit for the UHF range with a capacitance diode at the base and an alignment inductance having one end connected to said capacitance diode for the alignment at the upper frequency band end; the other end of said alignment inductance is connected to said first circuit means and connectable via said switch to ground; and said output of said VHF selection filter is connected via said second circuit means between said other end of said alignment inductance and said switch.

8. An input circuit according to claim 7 wherein said switch is a switching diode which is in the conducting switched state during UHF operation.

9. An input circuit according to claim 7 wherein said VHF selection filter comprises: first and second parallelly connecting band-pass filters for the VHF low-band and high-band ranges, respectively; and means, including repective switching diodes connected to said band-pass filters, for selectively short circuiting said band-pass filters to ground.

10. An input circuit according to claim 9 further comprising a low-pass filter with an upper limit frequency which lies between the UHF range and the VHF high-band range connected between said antenna terminal and the commonly connected inputs of said band-pass filters.

11. An input circuit for a combined UHF and VHF tuner comprising in combination: a common antenna terminal; a UHF selection filter and a VHF selection filter each having its input connected to said common antenna terminal; a common output amplifier for said input circuit, said amplifier having its input connected for high frequency to the output of said UHF selection filter; an impedance included in said UHF selection filter and having one end connected to said output of said UHF selection filter; first circuit means connecting the output of said VHF selection filter to the other end of said impedance; and second circuit means, including a selectively actuatable switch, for connecting said other end of said impedance to ground for high frequency via said switch to actuate said UHF selection filter and short circuit said output of said VHF selection filter, respectively, when said switch is closed, and for detuning said UHF selection filter and permitting VHF output signals from said VHF selection filter to pass to said input of said amplifier via said impedance when said switch is open.

12. An input circuit as defined in claim 11 wherein: said UHF selection filter is a high-pass filter for the UHF range including first and second shunt inductances at the input and output sides, respectively, of said high-pass filter, with said second shunt inductance constituting said impedance; a further switch is connected in the series path of said high-pass filter between said shunt inductances; and circuit means are provided for controlling said switches so that they both assume the same switched states.

13. An input circuit as defined in claim 12 wherein: said switch is a switching diode; said further switch is a PIN diode; said circuit means for controlling includes respective resistors connecting the anodes of said diodes to an input terminal for a control voltage for causing said diodes to conduct; the cathode of said PIN diode is connected to one end of said first shunt inductances whose other end is directly connected to ground; and said switching diode has its cathode connected to ground.

14. An input circuit as defined in claim 12 further comprising a low-pass filter having an upper limit frequency which lies between the UHF range and the VHF high-band range connected between the said antenna terminal and said input of said VHF selection filter; and wherein said VHF selection filter includes a high-pass filter for the VHF high-band range whose lower limit frequency lies above the VHF low-band range.

15. An input circuit as defined in claim 14 wherein said VHF selection filter further includes: a further low-pass filter having two series-connected inductances connected between the output of said high-pass filter and said output of said VHF selection filter, and a capacitor connecting the common connection of said two series-connected inductances to ground; a further switching diode connected across said two series-connected inductances; and means for selectively causing said further switching diode to conduct current and short circuit said further low-pass filter so that said VHF selection filter constitutes said high-pass filter for the VHF high-band range when current is flowing through said further switching diode and constitutes a band-pass filter for the VHF low-band range when no current is flowing through said switching diodes.

16. An input circuit as defined in claim 11 wherein: said UHF selection filter is a tuneable series resonant circuit for the UHF range having one end connected to said antenna terminal and its other end connected via a capacitance tuning diode to ground; and said second circuit means connects said switch to the common connection of said resonant circuit and said diode.

17. An input circuit as defined in claim 16 wherein: said second circuit means includes an inductance having one end connected between said common connection of said resonant circuit and said diode and its other end connected to said switch; and said output of said VHF selection filter is connected via said first circuit means between said other end of said inductance and said switch.

* * * * *